US010038442B2

(12) United States Patent
Artelsmair

(10) Patent No.: US 10,038,442 B2
(45) Date of Patent: Jul. 31, 2018

(54) CIRCUIT ARRANGEMENT FOR CONTROLLING A TRANSISTOR

(71) Applicant: FRONIUS INTERNATIONAL GmbH, Pettenbach (AT)

(72) Inventor: Bernhard Artelsmair, Pettenbach (AT)

(73) Assignee: FRONIUS INTERNATIONAL GmbH, Pettenbach (AU)

( * ) Notice: Subject to any disclaimer, the term of this patent is extended or adjusted under 35 U.S.C. 154(b) by 0 days.

(21) Appl. No.: 15/567,138

(22) PCT Filed: Jun. 30, 2016

(86) PCT No.: PCT/EP2016/065230
§ 371 (c)(1),
(2) Date: Oct. 17, 2017

(87) PCT Pub. No.: WO2017/001535
PCT Pub. Date: Jan. 5, 2017

(65) Prior Publication Data
US 2018/0102775 A1    Apr. 12, 2018

(30) Foreign Application Priority Data
Jun. 30, 2015   (EP) ................................. 15174575

(51) Int. Cl.
*H03B 1/00* (2006.01)
*H03K 3/00* (2006.01)
(Continued)

(52) U.S. Cl.
CPC ..... *H03K 17/687* (2013.01); *H03K 17/04123* (2013.01); *H03K 17/08122* (2013.01); *H03K 2217/009* (2013.01)

(58) Field of Classification Search
CPC ........... H03K 17/687; H03K 17/04123; H03K 17/08122; H03K 2217/009
(Continued)

(56) References Cited

U.S. PATENT DOCUMENTS 6,208,535 B1   3/2001  Parks
7,332,942 B2 *  2/2008  Gotzenberger .. H03K 17/08122
                                                   327/109
(Continued)

FOREIGN PATENT DOCUMENTS

DE    10 2009 006618 A1    8/2010

OTHER PUBLICATIONS

International Search Report of PCT/EP2016/065230, dated Oct. 4, 2016.
(Continued)

*Primary Examiner* — Thomas Skibinski
(74) *Attorney, Agent, or Firm* — Collard & Roe, P.C.

(57) ABSTRACT

A circuit arrangement for controlling a transistor with an insulated gate, a gate driver for generating a driver signal, and a capacitor parallel to the gate-source path of the transistor, wherein the gate driver is designed for generating a driver signal greater than or equal to zero volts, an inductor is provided for forming a resonant circuit with the capacitor, and a switching element is provided in the resonant circuit, which is designed for interrupting the resonant circuit after recharging the capacitor. The part of the circuit arrangement downstream of the gate driver is designed for exclusive voltage supply using the driver signal of the gate driver, and the switching element is formed by an additional transistor, a first freewheeling diode is arranged parallel to the switching element, and the inductor of the resonant circuit is arranged between the additional transistor and the gate of the transistor.

11 Claims, 3 Drawing Sheets

(51) Int. Cl.
  *H03K 17/687* (2006.01)
  *H03K 17/0412* (2006.01)
  *H03K 17/0812* (2006.01)

(58) Field of Classification Search
  USPC .... 327/108–112, 427, 434, 437; 326/82, 83, 326/87
  See application file for complete search history.

(56) References Cited

U.S. PATENT DOCUMENTS

| | | | |
|---|---|---|---|
| 8,427,226 B2* | 4/2013 | Grbovic | H03K 17/163 327/108 |
| 2006/0034114 A1* | 2/2006 | Omura | H03K 17/04123 365/149 |
| 2011/0019454 A1* | 1/2011 | Fotherby | H02M 1/08 363/132 |
| 2011/0221480 A1 | 9/2011 | Ikeda | |
| 2012/0206170 A1* | 8/2012 | Kimura | H03K 17/04123 327/109 |
| 2013/0162322 A1* | 6/2013 | Tao | H03K 17/04123 327/381 |
| 2014/0002145 A1* | 1/2014 | Mauder | H03K 17/06 327/109 |
| 2015/0061731 A1* | 3/2015 | Tabata | H03K 17/165 327/109 |
| 2016/0072500 A1* | 3/2016 | Naka | H03K 17/687 323/271 |

OTHER PUBLICATIONS

European Office Action in EP 15174575.9-1805, dated Jan. 20, 2016, with English translation of relevant parts.

Teerakawanich et al., A New Resonant Gate Driver with Biopolar Gate Voltage and Gate Energy Recovery, Applied Power Electronics Conference and Exposition (APEC), 2013, 28 annual, IEEE, Mar. 17, 2013, pp. 2424 to 2428.

Bergh T et al., "A Resonant Galvanically Separated Power MOSFET/IGBT Gate Driver", 2004 35th Annual IEEE Power Electronics Specialists Conference, Aachen, Germany, 2004, pp. 3243-3247.

\* cited by examiner

CIRCUIT ARRANGEMENT FOR CONTROLLING A TRANSISTOR

CROSS REFERENCE TO RELATED APPLICATIONS

This application is the National Stage of PCT/EP2016/065230 filed on Jun. 30, 2016, which claims priority under 35 U.S.C. § 119 of European Application No. 15174575.9 filed on Jun. 30, 2015, the disclosure of which is incorporated by reference. The international application under PCT article 21(2) was not published in English.

The invention relates to a circuit arrangement for controlling a transistor with an insulated gate, in particular an IGBT, a MOSFET or a GaN FET or a SiC FET, with a gate driver for generating a driver signal between a positive pole and a negative pole with a first driver voltage for activating the transistor during an activation phase and a second driver voltage for deactivating the transistor during a deactivation phase, and with a capacitor parallel to the gate-source junction of the transistor, wherein the gate driver is designed to generate a driver signal greater than or equal to 0 V, an inductor for forming a resonant circuit with the capacitor, wherein the resonant circuit is designed to recharge the capacitor to a negative gate-source voltage lying below the second driver voltage when deactivating the transistor with a change in the driver signal to the second driver voltage, and a switching element is provided in the resonant circuit, wherein the switching element is designed to interrupt the resonant circuit after recharging the capacitor.

Figure 1:
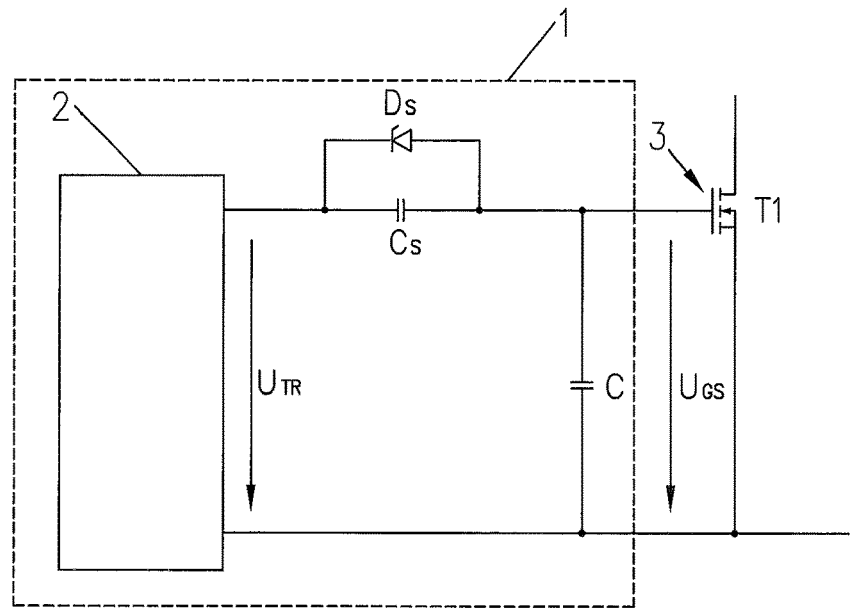

Known in the art are gate drivers for activating and deactivating a transistor with an insulated gate of a power electronic circuit. For example, the transistor can consist of an IGBT, MOSFET, GaN FET or SiC FET. For example, simple gate drivers are designed to generate a first driver voltage for activating the transistor, and a second driver voltage for deactivating the transistor. In order to reliably deactivate and lock the transistor, it may be necessary to charge the gate of the transistor to a negative gate voltage (for an n-channel type of a transistor). Otherwise, already slight voltage fluctuations or interferences can undesirably activate the transistor, which can also lead to a short circuit, depending on whether the power electronic circuit is used. To ensure a reliable deactivation and locking, a negative driver voltage is therefore usually applied to a capacitor at the gate of the transistor. For example, one common method involves supplying a gate driver with a negative voltage. However, this is not advantageous due to the outlay associated with generating the negative voltage supply. In order to avoid the outlay involving the negative voltage supply, in particular voltage supplies given a bridge circuit of transistors in a power electronic circuit, use is in part also made of circuit arrangements 1 according to FIG. 1. A capacitance $C_S$ is here situated parallel to a Z-diode $D_S$ between the gate driver 2 and gate 3 of the transistor T1. During the activation phase of the transistor T1, $C_S$ is charged to a voltage potential that is available as a negative voltage during the deactivation phase. Since the capacitance $C_S$ must charge the capacitor C parallel to the gate-source path of the transistor T1 to a negative gate voltage $U_{GS}$ during the deactivation phase, it must be given correspondingly large dimensions. As a disadvantageous result, the desired negative voltage potential is most often only achieved after several switching cycles, since the short activation phases might in some cases not be sufficient for completely charging the capacitor $C_S$, so that the capacitor $C_S$ must be charged over several activation phases. Another obvious disadvantage to a circuit arrangement 1 according to FIG. 1 is that the negative gate voltage $U_{GS}$ is branched away from the positive driver voltage $U_{TR}$, so to speak, and thus is no longer available for activating the transistor T1. The positive gate voltage $U_{GS}$ for activating the transistor T1 becomes correspondingly smaller, and reliable activation can in some cases only be achieved with an elevated circuit complexity.

US 2011/221480 A1 describes a circuit arrangement of the kind in question, wherein a separate power supply is required for a part of the circuit arrangement, which correspondingly increases the outlay.

The article by Nithiphat Teerakawanich et al. entitled "A New Resonant Gate Driver with Bipolar Voltage and Gate Energy Recovery" (Applied Power Electronics Conference and Exposition (APEC), 2013, 28 annual, IEEE, Mar. 17, 2013, pages 2424 to 2428) disclosed a resonant gate driver for controlling transistors, such as MOSFETs and IGBTs, in which the energy stored in the gate capacitor is used for the next switching cycle, making it possible to achieve a simpler and more cost-effective circuit arrangement.

Proceeding from the prior art as described at the outset, the object of the invention is thus to create a circuit for controlling a transistor that can reliably activate and deactivate the transistor even without a negative supply voltage, and ensures a reliable locking of the transistor during the deactivation phase. In addition, this circuit arrangement is to exhibit a simple and cost-effective structural design. The invention achieves this stated object by virtue of the fact that part of the circuit arrangement downstream from the gate driver is designed for exclusive voltage supply using the driver signal of the gate driver, and that the switching element is formed by an additional transistor, and a first freewheeling diode is arranged parallel to the switching element, and the inductor of the resonant circuit is arranged between the additional transistor and gate of the transistor.

If an inductor is connected with the capacitor parallel to the gate-source junction of the transistor, and the resultantly formed resonant circuit is designed for a negative gate-source voltage lying below the second driver voltage while deactivating the transistor for recharging the capacitor at the gate of the transistor, a reliable deactivation of the transistor can be ensured. The switching element in the resonant circuit makes it possible to separate the resonant circuit, thereby retaining the negative gate-source voltage that arises in the recharging process. This is because the capacitor charged to the negative gate-source voltage at the gate of the transistor cannot be discharged further owing to the open switching element, allowing the negative gate-source voltage to remain in place. When changing the driver signal from the first driver voltage to the second driver voltage for deactivating the transistor, the circuit arrangement according to the invention can be used to discharge the positively charged capacitor parallel to the gate-source junction of the transistor via the inductor. The energy transferred into the inductor during this discharging process can cause the capacitor to discharge further at the gate to a negative gate-source voltage. A repeated recharging process can be prevented by simultaneously opening the switching element, making it possible to achieve and maintain a negative gate-source voltage lying below the second driver voltage. For this reason, the circuit arrangement can charge the capacitor parallel to the gate-source junction of the transistor to a negative voltage during the first deactivation already, while the complete positive driver voltage can still be made available during the activation phase of the transistor. In addition, the circuit arrangement can be given a simple structural design and cost effectively manufactured in terms of circuit technology due to the few and simple components. Because the part of the circuit arrangement downstream from the gate driver is designed for exclusive power supply using the driver signal of the gate driver, there is no need for an additional voltage supply, which reduces the complexity of the entire circuit arrangement, and hence the costs as well. Due to the first freewheeling diode arranged parallel to the switching element, the current flow required while deactivating the transistor for effectively recharging the capacitor parallel to the gate-source junction of the transistor can be easily guided past the switching element. The circuit arrangement can be simplified by having the first freewheeling diode be formed by the freewheeling diode integrated into the additional transistor.

Let it generally be noted that this circuit arrangement is especially well suited for controlling transistors in power electronic circuits with regularly repeating switching processes, such as in bridge circuits. In this conjunction, the deactivation phase is understood as the duration until the repeated activation of the same transistor. For example, this duration can lie within a range of a few μs to several 100 ms.

If the gate-source voltage remains negative during the entire deactivation phase, not only can a reliable deactivation of the transistor be ensured, but an unintended reactivation of the transistor during the deactivation phase can be prevented as well.

The circuit arrangement can prove advantageous if the gate-source voltage essentially corresponds to the first driver voltage during the activation phase. In this way, the entire first driver voltage can be used to activate or charge the capacitor parallel to the gate-source junction of the transistor.

Especially simple gate drivers can be used if the second driver voltage measures 0 V.

The switching element is advantageously activated at the first driver voltage of the driver signal, and deactivated at the second driver voltage of the driver signal. This makes it easy to realize the circuit arrangement, since no additional signal is necessary for switching the switching element. As a result, expensive or complicated circuits are not required.

Special simplicity from the standpoint of circuit technology allows the circuit arrangement to inspire confidence when the switching element consists of a p-channel field effect transistor or PNP transistor. This makes it possible to arrange the additional transistor between the inductor and driver signal, as well as to control the additional transistor without any further components.

The circuit arrangement can be further improved by connecting the gate or base terminal of the additional transistor with the negative pole of the gate driver by means of a first resistor, and connecting the source or emitter terminal of the additional transistor with the positive pole of the gate driver. This makes it possible to place a limitation on the base current or gate charging current, so that damage to the additional transistor can be prevented.

If a second resistor is arranged between the inductor and gate of the transistor, this resistor can be used to determine the circuit damping. This can permit a sufficiently fast process of charging the capacitor parallel to the gate-source junction of the transistor with little or no overshoot.

The circuit arrangement can be further improved by arranging a third resistor in series with a second freewheeling diode parallel to the second resistor. This can permit a variable damping of the circuit while activating or deactivating the transistor, so that the gate-source voltage can be charged to the desired potential for activating or deactivating the transistor with a respectively low overshoot.

Given a suitable dimensioning of the individual components, the circuit arrangement can be further simplified if the capacitor is formed by the gate-source capacitor of the transistor. This eliminates the need for an additional capacitor between the gate and source of the transistor.

If a fourth resistor is arranged parallel to the capacitor, the gate-source voltage can still be defined in the absence of the voltage supply of the gate driver, thereby preventing the gate-source voltage from "floating".

The gate of the transistor can be protected against excessively high positive or negative voltages by arranging two diametrically opposed Z-diodes connected in series parallel to the capacitor. In addition, these Z-diodes can be used to limit an overshoot of the gate-source voltage during the process of activating the transistor.

Figure 2:
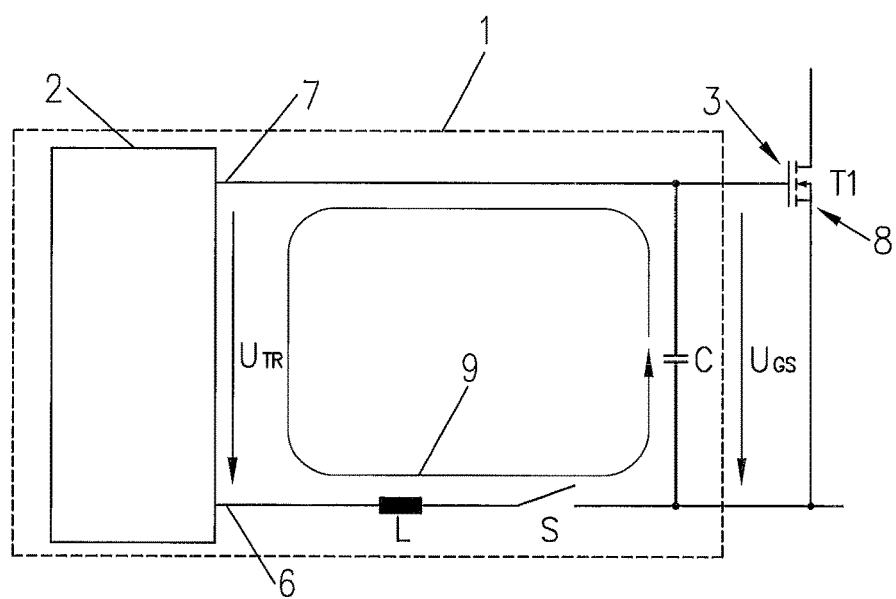
Figure 3:
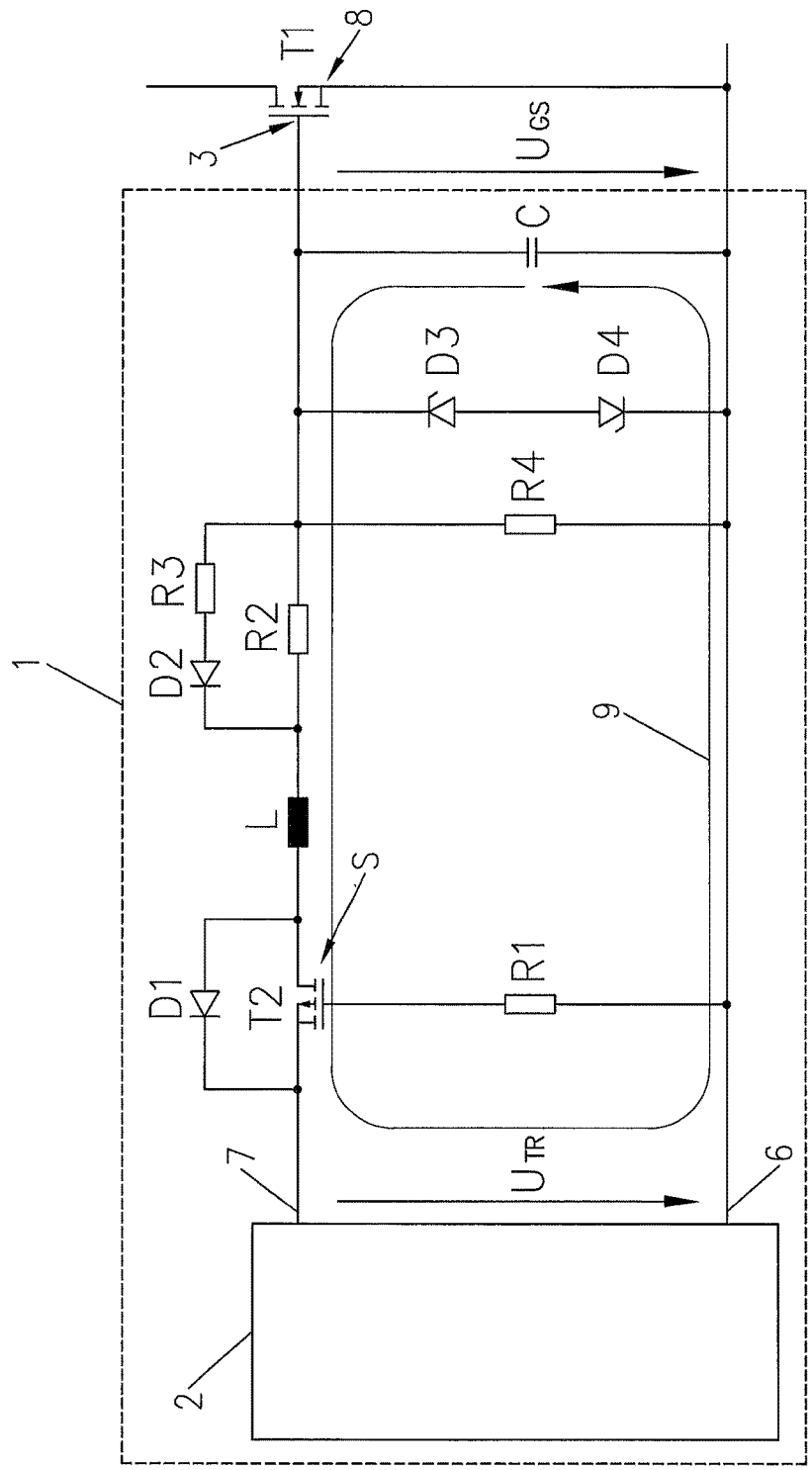
Figure 4:
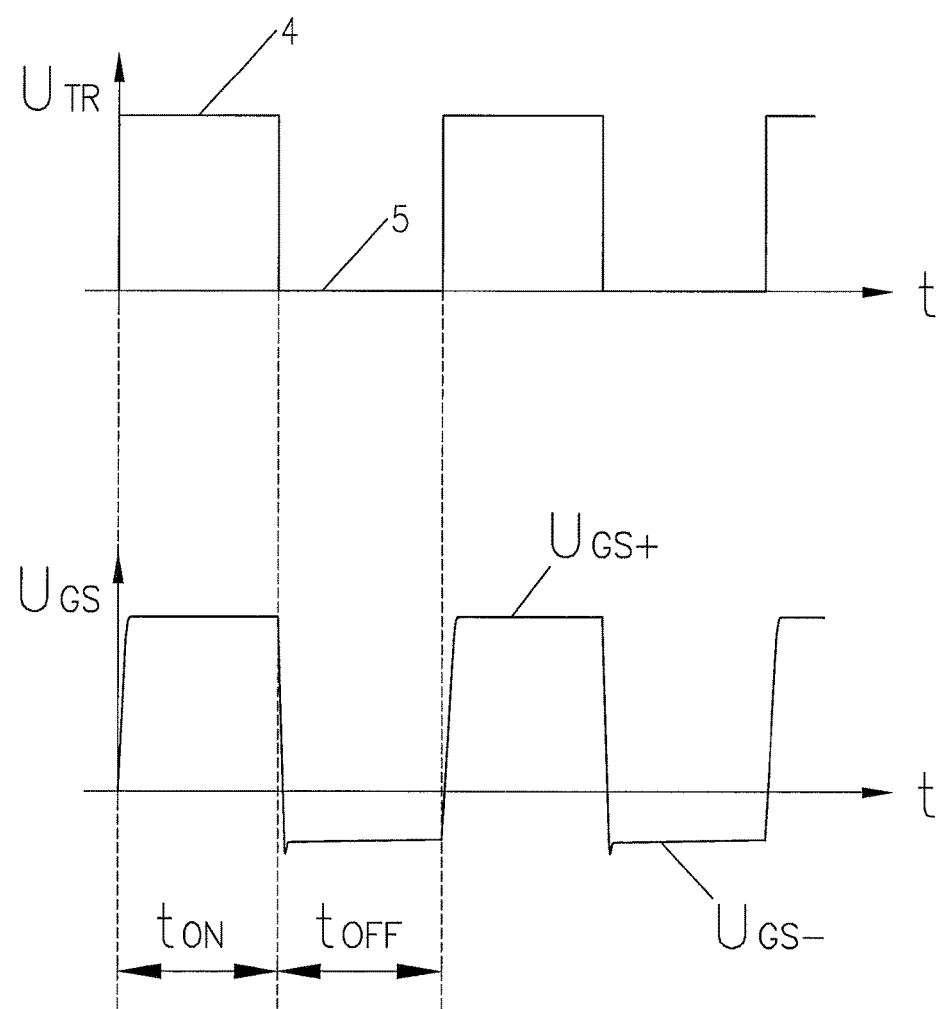

The present invention will be explained in greater detail below drawing reference to the figures, which exemplarily, schematically and unrestrictedly depict advantageous embodiments of the invention. Shown here on:

FIG. 1 is a circuit arrangement for controlling a transistor according to prior art, FIG. 2 is a schematic sketch of a circuit arrangement according to the invention for controlling a transistor, FIG. 3 is a specific configuration of a circuit arrangement according to the invention, and FIG. 4 are the voltage progressions of the circuit arrangement according to FIG. 3 of the gate driver, and on the capacitor parallel to the gate-source junction of the transistor.

FIG. 2 shows a schematic sketch of a circuit arrangement 1 for controlling a transistor T1 with an isolated gate 3, in particular an IGBT, a MOSFET or a GaN FET or a SiC FET having a gate driver 2 for generating a driver signal $U_{TR}$ between a positive pole 7 and a negative pole 6. In order to control the transistor T1, the gate driver 2 outputs a driver signal $U_{TR}$ measuring greater than or equal to zero volts, so as to charge or discharge a capacitor C at the gate 3 of the transistor T1 to a gate-source voltage $U_{GS}$. According to FIG. 4, the driver signal $U_{TR}$ to this end exhibits a first driver voltage 4 for activating and a second driver voltage 5 for deactivating the transistor T1. In order to reliably deactivate and lock the transistor T1, it is advantageous to charge the gate of the transistor T1 to a negative gate-source voltage $U_{GS}$. Otherwise, already small voltage fluctuations or interferences can lead to an undesired activation or short-term gating of the transistor, which could also translate into a short circuit, depending on the application of the power electronic circuit (not shown).

According to the invention, this is why the capacitor C has connected to it parallel to the gate 3-source 8 junction of the transistor T1 an inductor L, which together with the capacitor C of the transistor T1 forms a resonant circuit 9. By correspondingly dimensioning the components, this resonant circuit 9, while deactivating the transistor T1, is designed to recharge the capacitor C parallel to the gate 3-source 8 junction of the transistor T1 to a negative gate-source voltage $U_{GS}$ lying below the second driver voltage 5. As the gate driver 2 is switched from the first 4 to the second driver voltage 5, the energy stored in the capacitor C is discharged, inducing a flow of current through the inductor L. Even if the capacitor C is discharged, this current flow is maintained, since sudden changes in current are prevented by the inductor L. The magnetic energy present in the inductor L thereby triggers a further discharging or recharging of the capacitor C to a negative gate-source voltage $U_{GS}$ lying below the second driver voltage 5. In addition, a switching element S is arranged in the resonant circuit 9, which makes it possible to separate the resonant circuit 9. The separated resonant circuit 9 prevents a renewed recharging of the capacitor C, so that the negative gate-source voltage $U_{GS}$ is maintained. In the shown circuit arrangement 1, this negative gate-source voltage $U_{GS}$ ensures the reliable deactivation and locking of the transistor T1. This effectively prevents an undesired activation or short-term gating of the transistor T1, which could potentially be caused by slight voltage fluctuations or interferences. The circuit arrangement 1 especially advantageously charges the capacitor C at the gate 3 of the transistor T1 to a negative voltage already at the first deactivation. Nonetheless, the complete positive first driver voltage 4 for activating the transistor T1 is available during the activation phase $t_{ON}$ of the transistor T1. In addition, this circuit arrangement 1 is simple in design with respect to circuit technology and inexpensive to manufacture owing to the few and simple components. In the depicted examples according to FIGS. 2 and 3, the transistor T1 is a self-locking n channel FET. Naturally, use for other transistor types is conceivable by correspondingly modifying the circuit arrangement.

In general, let it be stated that the inductor L need not absolutely be comprised of a discrete component, but rather can also consist of a line on a circuit board.

The depicted circuit arrangement 1 is also suitable for controlling transistors T1 of power electronic circuits with regularly repeating switching processes, such as in bridge circuits. Depending on the switching frequency, the deactivation phase $t_{OFF}$ of the transistor T1 measures a few μs to several 100 ms. Given a suitable dimensioning of the resonant circuit 9, i.e., the inductor L, capacitor C and possibly present resistors, the gate-source voltage $U_{GS}$ remains negative during this entire deactivation phase $t_{OFF}$. This not only ensures a reliable deactivation of the transistor T1, but also prevents an undesired reactivation of the transistor T1 during the deactivation phase $t_{OFF}$.

As evident from the specific embodiment according to FIG. 3, the gate-source voltage $U_{GS}$ during the activation phase $t_{ON}$ essentially corresponds to the driver voltage 4. As a consequence, the entire voltage is available to the first drive voltage 4 for activating or charging the capacitor C parallel to the gate 3-source 8 junction of the transistor T1, thereby allowing fast and reliable switching processes. The slight deviations from the first driver voltage 4 are caused by the charging process of the capacitor C and potential losses in the circuit arrangement 1. By contrast, the second driver voltage 5 is 0 V, which enables an especially simple structural design for the gate driver 2, and thus the use of cost-effective gate drivers 2.

In addition, the part of the circuit arrangement 1 downstream from the gate driver 2 is designed for exclusive voltage supply using the driver signal $U_{TB}$, as evident from FIGS. 2 and 3. Accordingly, only one voltage source not shown on the figures is needed for supplying voltage to the gate driver 2, so as to supply the entire circuit arrangement 1 with electrical energy. The gate driver 2 then supplies the downstream part of the circuit arrangement 1 with electrical energy via its driver signal $U_{TR}$. Doing without an additional voltage supply reduces both the complexity of the entire circuit arrangement and its costs.

A first freewheeling diode D1 is arranged parallel to the switching element S in the circuit arrangement 1. Despite the open switching element S, the latter makes it possible to continue the recharging process up to a change in direction of the current flow. This change in direction of the current flow arises once the energy stored the inductor L has again been completely discharged. This corresponds to the desired end of the recharging process, since the voltage on the capacitor C lies in the range of its negative maximum at this point in time. Therefore, using the freewheeling electrode D1 makes it possible to open the switching element S at any point in time between the change from the first driver voltage 4 to the second driver voltage 5 and end of the recharging process of the capacitor C to the negative gate-source voltage $U_{GS}$. This permits additional simplifications of the circuit arrangement 1, since the driver signal $U_{TR}$ can also be used directly to switch the switching element S.

Accordingly, the switching element S in the circuit arrangement 1 according to FIG. 3 is activated at the first driver voltage 4 of the driver signal $U_{TR}$, and deactivated at the second driver voltage 5 of the driver signal $U_{TR}$. As already mentioned above, no additional signal is thus required for switching the switching element S, which enables an easily realizable circuit arrangement 1.

The circuit arrangement 1 according to FIG. 3 has an especially simple design in terms of circuit technology, since the switching element S is comprised of an additional transistor T2. This makes it possible to arrange the additional transistor T2 between the inductor L and driver signal $U_{TR}$, as well as to control the additional transistor T2 without additional components. While the additional transistor T2 consists of a P channel FET in the example shown, the use of a PNP transistor is also conceivable.

As shown on FIG. 3, the gate terminal of the additional transistor T2 is connected by way of a first resistor R1 with the negative pole 6 of the gate driver 2, and the source terminal is connected with the positive pole 7 of the gate driver 2. This limits the gate charging current of the additional transistor T2, while at the same time making it easy to control a P-channel FET using a low number of components. The connection between the negative pole 6 of the gate driver 2 and a ground terminal can be adjustable, but does not absolutely have to be.

It is further conceivable that no decided first freewheeling diode D1 be used, but rather that the first freewheeling diode D1 be comprised of the freewheeling diode integrated into the additional transistor T2, in particular the one integrated into the P channel FET. The component outlay for the circuit arrangement 1 can be further reduced in this way.

A second resistor R2 can be arranged between the inductor L and gate of the transistor T1. This resistor R2 determines the damping of the resonant circuit 9 for the activation process, and thus influences the charging process of the capacitor C parallel to the gate-source junction of the transistor T1. A suitable component dimensioning thereby prevents an overshoot of the gate-source voltage $U_{GS}$ while activating the transistor T1.

A third resistor R can be arranged in series with a second freewheeling diode D2 parallel to the second resistor R2. This third resistor R3 is used to set a varying damping for the resonant circuit 9 while deactivating the transistor T1. This makes it possible to achieve a reduction in the overshoot of the gate-source voltage $U_{GS}$ during deactivation and the recharging of the capacitor C associated therewith. The charging and discharging or recharging process can in this way be separately influenced, which allows optimizations in relation to the edge steepness and overshoot of the gate-source voltage $U_{GS}$.

Additional simplifications arise when the capacitor C consists of the gate-source capacitor of the transistor T1. This eliminates the need for an additional capacitor C between the gate 3 and source 8.

A fourth resistor R4 can be arranged parallel to the capacitor C so as to still define the gate-source voltage $U_{GS}$ given no voltage supply for the gate driver 2, and thereby prevent the gate-source voltage $U_{GS}$ from "floating".

In order to protect the gate 3 of the transistor T1 against too high a positive or negative gate-source voltage $U_{GS}$, two diametrically opposed Z-diodes D3, D4 connected in series are arranged parallel to the capacitor C. In addition, the Z-diodes D3, D4 prevent an overshoot of the gate-source voltage $U_{GS}$ during the activation process of the transistor T1. This yields a correspondingly advantageous, steep leading edge of the gate-source voltage $U_{GS}$ while switching from the first driver voltage 4 to the second driver voltage 5.

In an exemplary dimensioning of components of the circuit arrangement 1 according to FIG. 3, an edge decay time from the positive gate-source voltage $U_{GS}$ to the negative gate-source voltage $U_{GS}$ is desirably less than or equal to 100 ns, so as to keep the deactivation losses of the transistor T1 low. At the same time, the edge steepness is to be less than half the period duration of the resonant circuit 9, since the process of recharging the capacitor C concludes within half a period, and a renewed overshoot is precluded by the locking behavior of the diode D1. In the dimensioning example below, a period duration T=140 ns ($T=t_{ON}+t_{OFF}$) is assumed.

A capacitor C of 5 nF, which roughly corresponds to a typical gate-source capacitor of a power FET, and an edge decay time of 70 ns correspondingly yield an inductance L of roughly 100 nH according to the formula $$L = \frac{T^2}{4\pi^2 C}$$

Further exemplary dimensioning assumes a positive gate-source voltage $U_{GS+}$ of 20 V and a negative gate-source voltage $U_{GS-}$ of –5V. The formula $$R_{Ges} = -\frac{2L \ln \frac{U_{GS-}}{U_{GS+}}}{t}, \text{ with } t = \frac{T}{2}$$

Yields an overall ohmic resistance, including all losses, for the resonant circuit of about 4 ohm. Since the gate drivers and flux voltage of the diodes must be considered in addition to the ohmic losses of the inductor and capacitor, the individual resistors must be given correspondingly smaller dimensions, or the resistor R4 parallel to the capacitor must be given larger dimensions. In an exemplary dimensioning of the resistors R2 with 3.3 ohm, this yields R3 with 1 ohm and R4 with 10 kohm.

Of course, the values actually used for the inductor, capacitor and resistors can deviate from the indicated exemplary dimensioning. Depending on the individual requirements placed on the circuit arrangement 1, as well as on the transistor T1 and gate driver 2, dimensions for components with the above exemplary values can conceivably be a power of ten higher or lower.

The invention claimed is:

1. A circuit arrangement for controlling a transistor having an insulated gate, the circuit arrangement comprising:
    (a) a gate driver for generating a driver signal between a positive pole and a negative pole with a first driver voltage for activating the transistor during an activation phase and a second driver voltage for deactivating the transistor during a deactivation phase;
    (b) a capacitor parallel to a gate source junction of the transistor;
    (c) an inductor for forming a resonant circuit with the capacitor;
    (d) a switching element provided in the resonant circuit comprising an additional transistor; and
    (e) a first freewheeling diode arranged parallel to the switching element;
    wherein the gate driver for generating the driver signal is designed so that the driver signal is greater than or equal to 0 V;
    wherein the resonant circuit is designed to recharge the capacitor to a negative gate-source voltage ($U_{GS}$) less than the second driver voltage when deactivating the transistor with a change in the driver signal to the second driver voltage;
    wherein the switching element is designed to separate the resonant circuit from the gate driver after recharging the capacitor;
    wherein a part of the circuit arrangement is electrically downstream from the gate driver after output of the gate driver and is designed for voltage supply using the driver signal of the gate driver without requiring an additional voltage source to a voltage source supplying voltage to the gate driver; and
    wherein the inductor is arranged between the additional transistor and the insulated gate of the transistor.

2. The circuit arrangement according to claim 1, wherein the gate-source voltage is negative during the entire deactivation phase.

3. The circuit arrangement according to claim 1, wherein the gate-source voltage essentially corresponds to the first driver voltage of the gate driver during the activation phase.

4. The circuit arrangement according to claim 1, wherein the second driver voltage of the gate driver has a value of 0 V.

5. The circuit arrangement according to claim 1, wherein the switching element is designed for activation at the first driver voltage and for deactivation at the second driver voltage.

6. The circuit arrangement according to claim 1, wherein the switching element comprises a p-channel field effect transistor or PNP transistor.

7. The circuit arrangement according to claim 1, wherein the gate or base terminal of the additional transistor is connected with the negative pole of the gate driver by means of a first resistor, and the source or emitter terminal of the additional transistor is connected with the positive pole of the gate driver.

8. The circuit arrangement according to claim 1, wherein a second resistor is arranged between the inductor and gate of the transistor.

9. The circuit arrangement according to claim 8, wherein a third resistor is arranged in series with a second freewheeling diode parallel to the second resistor.

10. The circuit arrangement according to claim 1, wherein a fourth resistor is arranged parallel to the capacitor.

11. The circuit arrangement according to claim 1, wherein two diametrically opposed Z-diodes connected in series are arranged parallel to the capacitor.

* * * * *